United States Patent
Jung et al.

(10) Patent No.: US 8,144,509 B2
(45) Date of Patent: Mar. 27, 2012

(54) WRITE OPERATION FOR SPIN TRANSFER TORQUE MAGNETORESISTIVE RANDOM ACCESS MEMORY WITH REDUCED BIT CELL SIZE

(75) Inventors: Seong-Ook Jung, Seoul (KR); Mehdi Hamidi Sani, Rancho Santa Fe, CA (US); Seung H. Kang, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 816 days.

(21) Appl. No.: 12/163,359

(22) Filed: Jun. 27, 2008

(65) Prior Publication Data
US 2009/0323404 A1  Dec. 31, 2009

(51) Int. Cl.
*G11C 11/14* (2006.01)
(52) U.S. Cl. ......... 365/171; 365/148; 365/158; 977/933
(58) Field of Classification Search .................... 365/48, 365/55, 62, 66, 74, 78, 80–93, 100, 130, 365/131, 148, 158, 171–173, 225.5, 243.5; 216/22; 257/421, E21.665; 483/3; 977/933–935
See application file for complete search history.

(56) References Cited

U.S. PATENT DOCUMENTS
| | | | |
|---|---|---|---|
| 7,394,685 B2 | 7/2008 | Ooishi et al. | |
| 7,436,699 B2 | 10/2008 | Tanizaki et al. | |
| 2007/0279968 A1* | 12/2007 | Luo et al. | 365/158 |
| 2008/0219044 A1* | 9/2008 | Yoon et al. | 365/158 |

FOREIGN PATENT DOCUMENTS
EP   156810   8/2005

OTHER PUBLICATIONS
International Search Report—PCT/US2009/047878, International Search Authority—European Patent Office Aug. 25, 2009.
Written Opinion—PCT/US2009/047878, International Search Authority—European Patent Office Aug. 25, 2009.
Hosomi, M. et al.: "A novel nonvolatile memory with spin torque transfer magnetization switching: Spin-RAM," in IEEE International Electron Devices Meeting (IEDM) Technical Digest, Dec. 5, 2005, pp. 459-462.

* cited by examiner

*Primary Examiner* — Richard Elms
*Assistant Examiner* — Harry W Byrne
(74) *Attorney, Agent, or Firm* — Michelle Gallardo; Nicholas J. Pauley; Jonathan T. Velasco

(57) ABSTRACT

Systems, circuits and methods for controlling write operations in Spin Transfer Torque Magnetoresistive Random Access Memory (STT-MRAM) are disclosed. A reduced bit cell size is achieved by arranging the source lines (SL) substantially in parallel with the word lines (WL) and substantially perpendicular to the bit lines (BL). Further, in one embodiment during a write operation, a high logic/voltage level is applied to the bit lines of unselected bit cells to prevent an invalid write operation.

29 Claims, 11 Drawing Sheets

PARALLEL MAGNETIZATION
LOW RESISTANCE
STATE "0"

ANTIPARALLEL MAGNETIZATION
HIGH RESISTANCE
STATE "1"

< Signal timing for Block0>

< WL Driver & SL Selector >

< SL Driver >

WRITE OPERATION FOR SPIN TRANSFER TORQUE MAGNETORESISTIVE RANDOM ACCESS MEMORY WITH REDUCED BIT CELL SIZE

FIELD OF DISCLOSURE

Embodiments of the invention are related to random access memory (RAM). More particularly, embodiments of the invention are related to write operations in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and it will be appreciate that each layer illustrated may comprise one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. It will be appreciated that the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. In a conventional arrangement of the STT-MRAM array, such as illustrated in FIG. 4A, the source line (SL) is orthogonal to word line (WL) and is parallel with the bit line (BL). This arrangement increases the area used for the bit cell array and results in large bit cell size. The conventional arrangement promotes a stable write operation. For example, during the write operation, for a state "1" write (or "1" write) WL=H, BL=L and SL=H for the selected bit cell 410 and a proper write operation can be performed. As used herein H represents a high voltage/logic level and L represents a low voltage/logic level. For the unselected bit cells 420, the WL=H, BL=L and SL=L and thus there is no invalid write operation on the unselected bit cells.

However, while aiding in preventing invalid write operations, the conventional arrangement is inefficient in the area used per bit cell since the line cannot be shared which results in additional metal 1 (e.g., SL(M1) as illustrated) for source line as shown in FIG. 4B. As further, illustrated in the circuit layout of FIG. 4B, each bit line (BL) can be located on another metal layer (e.g., Mx) running substantially in parallel with the source lines.

SUMMARY

Exemplary embodiments of the invention are directed to systems, circuits and methods for improved write stability and reduced bit cell size in STT-MRAM.

An embodiment of the invention can include a Spin Transfer Torque Magnetoresistive Random Access Memory (STT-MRAM) comprising: a bit cell array having a source line substantially parallel to a word line coupled to a first row of bit cells, wherein the source line is substantially perpendicular to bit lines coupled to the first row of bit cells.

Another embodiment of the invention can include a method comprising: forming a Spin Transfer Torque Magnetoresistive Random Access Memory (STT-MRAM) bit cell array having a source line substantially parallel to a word line of a first row of bit cells and substantially perpendicular to bit lines coupled to the first row of bit cells.

An embodiment of the invention can include a method for writing data in a Spin Transfer Torque Magnetoresistive Random Access Memory (STT-MRAM) having a source line substantially parallel to a word line coupled to a first row of bit cells, wherein the source line is substantially perpendicular to bit lines coupled to the first row of bit cells, the method comprising: establishing a low voltage on a bit line of a selected bit cell coupled to the word line of the first row of bit cells and the source line; and establishing a high voltage on bit lines of unselected bit cells coupled to the word line of the first row of bit cells and the source line.

Another embodiment of the invention can include a Spin Transfer Torque Magnetoresistive Random Access Memory (STT-MRAM) having a source line substantially parallel to a word line coupled to a first row of bit cells, wherein the source line is substantially perpendicular to bit lines coupled to the first row of bit cells, the STT-MRAM comprising: means for establishing a low voltage on a bit line of a selected bit cell coupled to the word line of the first row of bit cells and the source line; and means for establishing a high voltage on bit lines of unselected bit cells coupled to the word line of the first row of bit cells and the source line.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, embodiments may be described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 5:
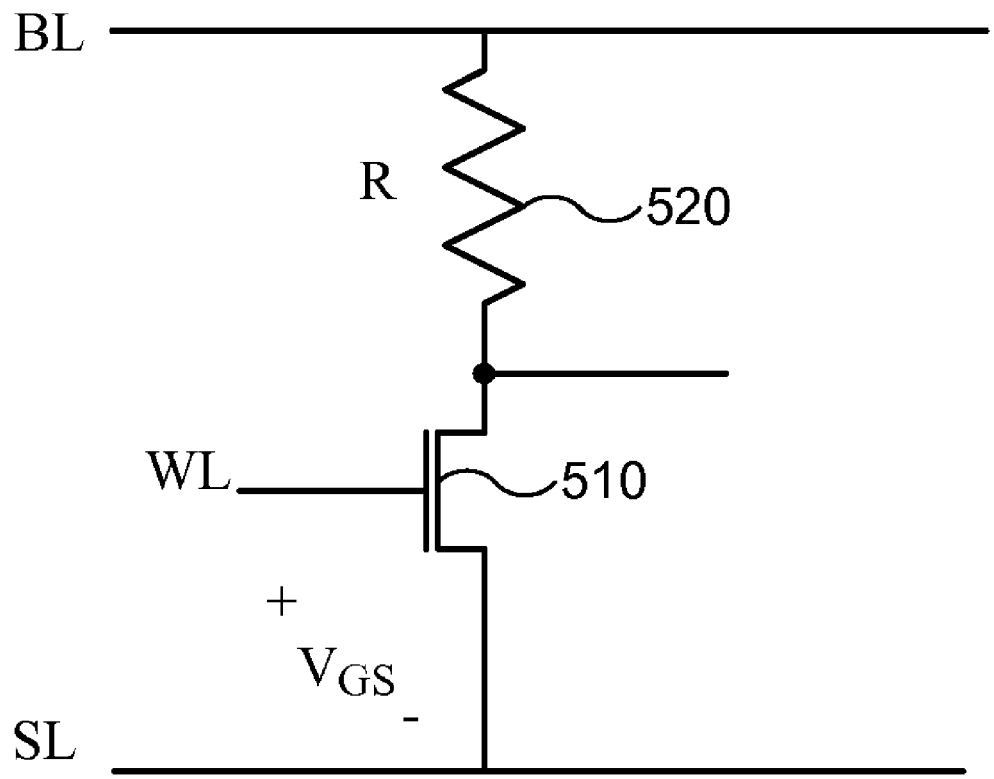
FIG. 5 is a simplified schematic of a STT-MRAM bit cell.

FIG. 5 illustrates a simplified schematic of a STT-MRAM bit cell. The bit cell includes a word line (WL) coupled to a word line transistor, 510. A storage element 520 (e.g., MTJ) is represented as a simple resistance. The transistor 510 and storage element 520 are disposed between a bit line (BL) and a source line (SL). During the write operation for state "0", WL=H, BL=H and SL=L and for state "1", WL=H, BL=L and SL=H. As used herein, H is a high voltage/logic level and L is a low voltage/logic level. The voltage levels may be supply voltage levels (e.g., Vdd and 0) or may be higher or lower than the supply voltages levels. It will be appreciated that the foregoing arrangement and state conditions are provided merely for discussion of embodiments of the invention and are not intended to limit the embodiments to the illustrated arrangements or state conditions discussed.

Figure 1A:
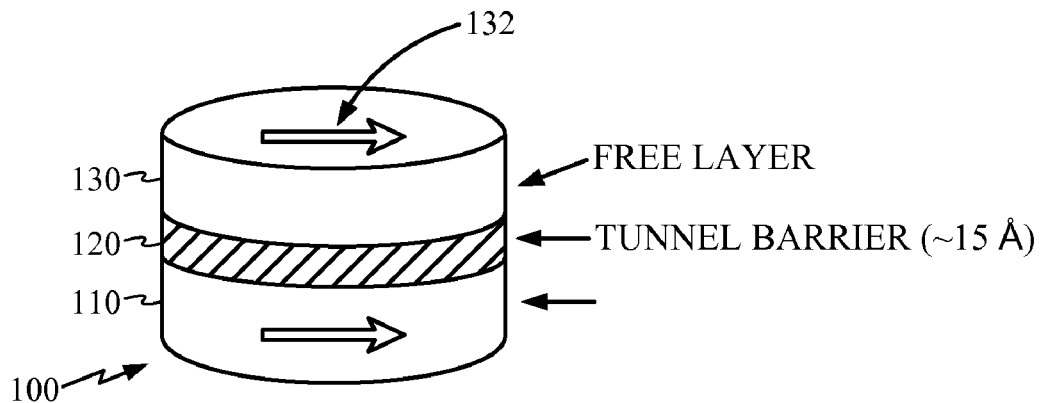
FIGS. 1A and 1B are illustrations of a magnetic tunnel junction (MTJ) storage element.
Figure 1B:
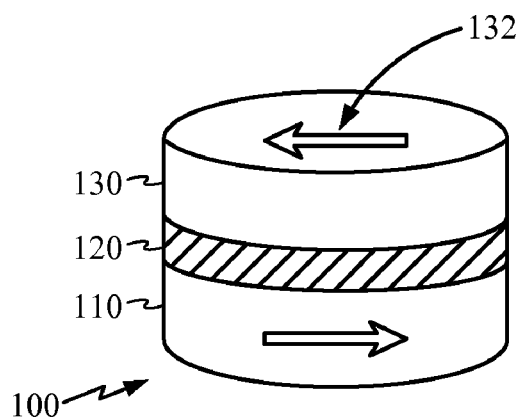
Figure 2A:
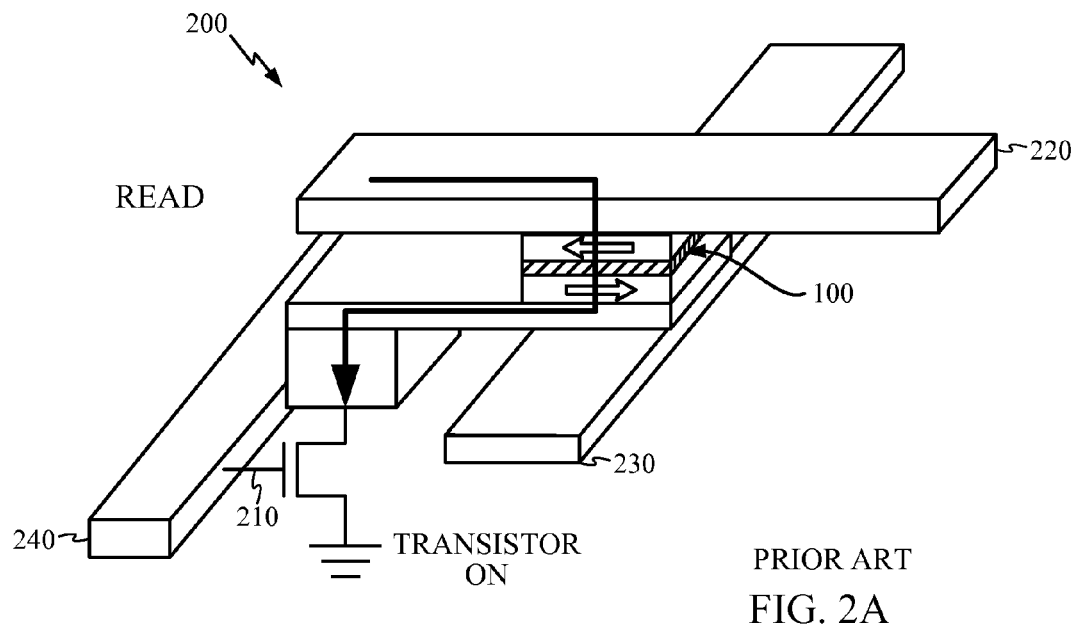
FIGS. 2A and 2B are illustrations of a Magnetoresistive Random Access Memory (MRAM) cell during read and write operations, respectively.
Figure 2B:
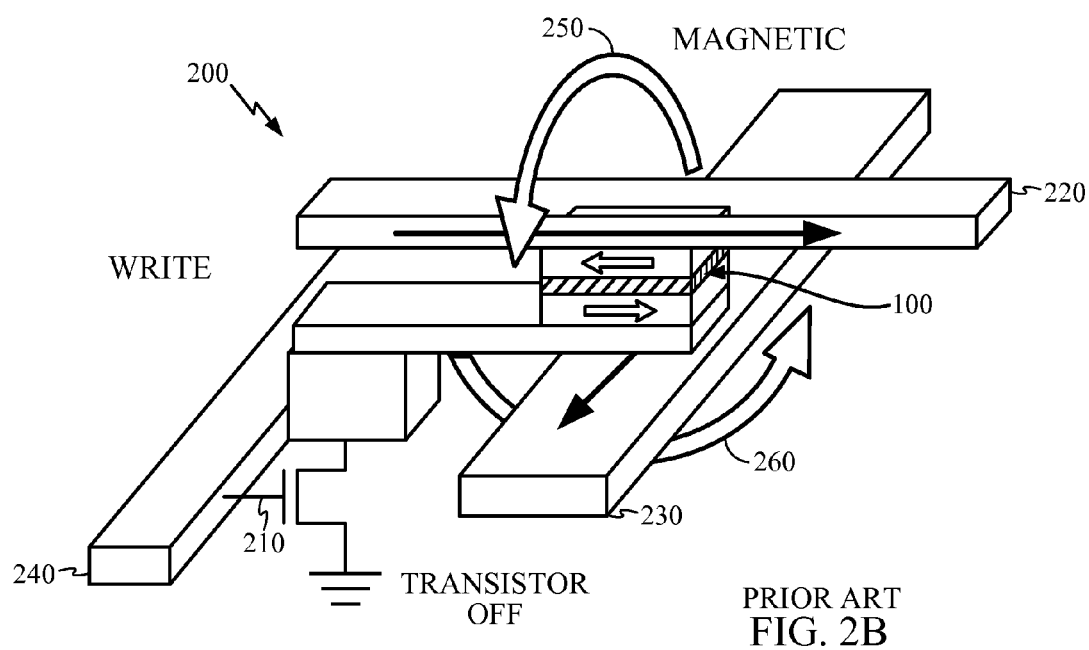
Figure 3A:
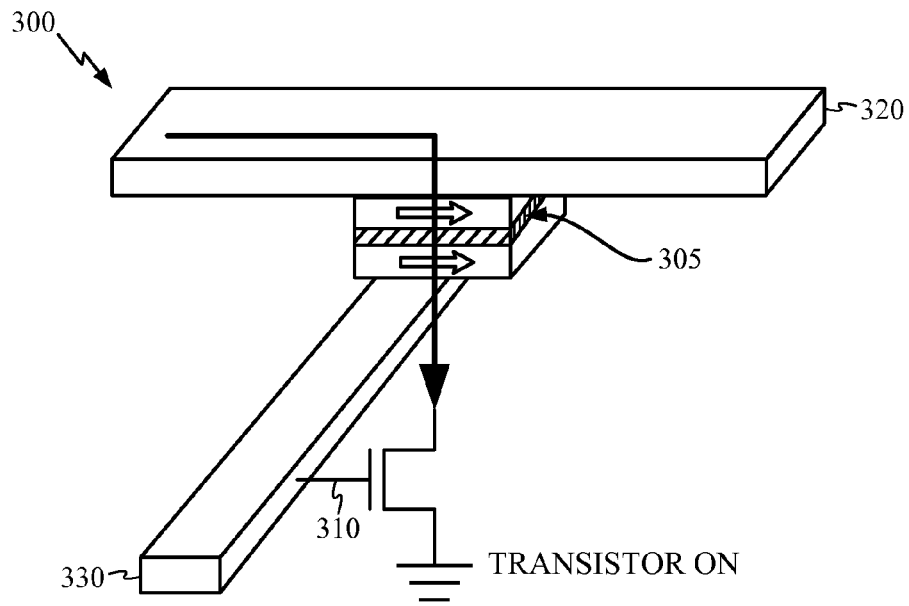
FIGS. 3A and 3B are illustrations of Spin Transfer Torque Magnetoresistive Random Access Memory (STT-MRAM) bit cells.
Figure 3B:
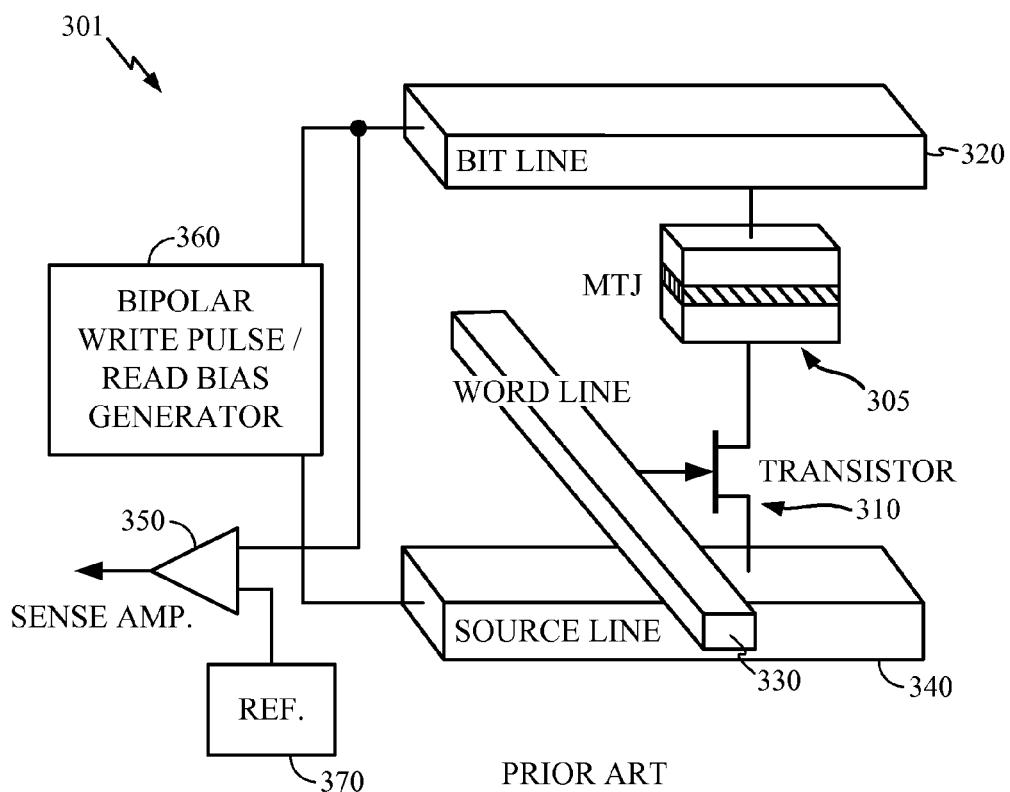
Figure 4A:
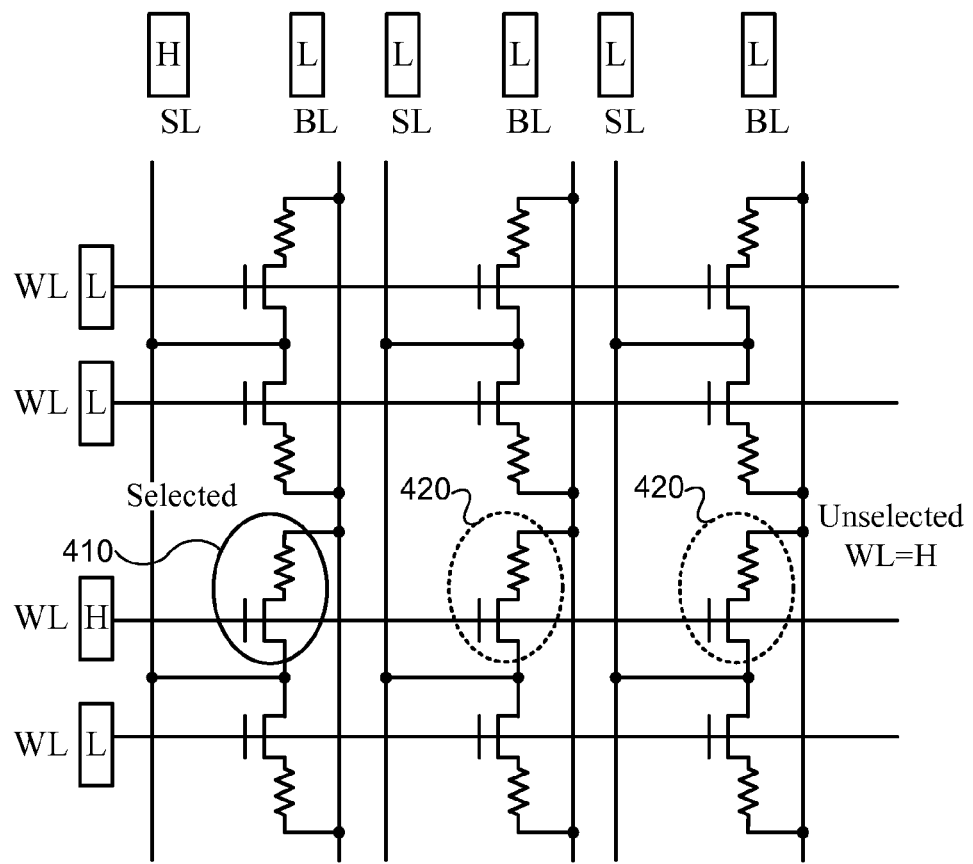
FIG. 4A is a schematic illustration of a conventional bit cell arrangement for a STT-MRAM and FIG. 4B is a layout of a conventional bit cell arrangement for a STT-MRAM.
Figure 4B:
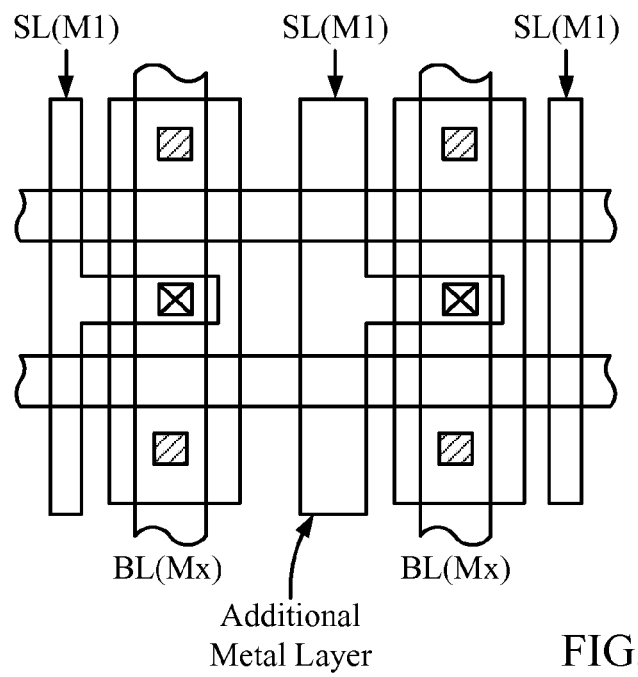
Figure 6A:
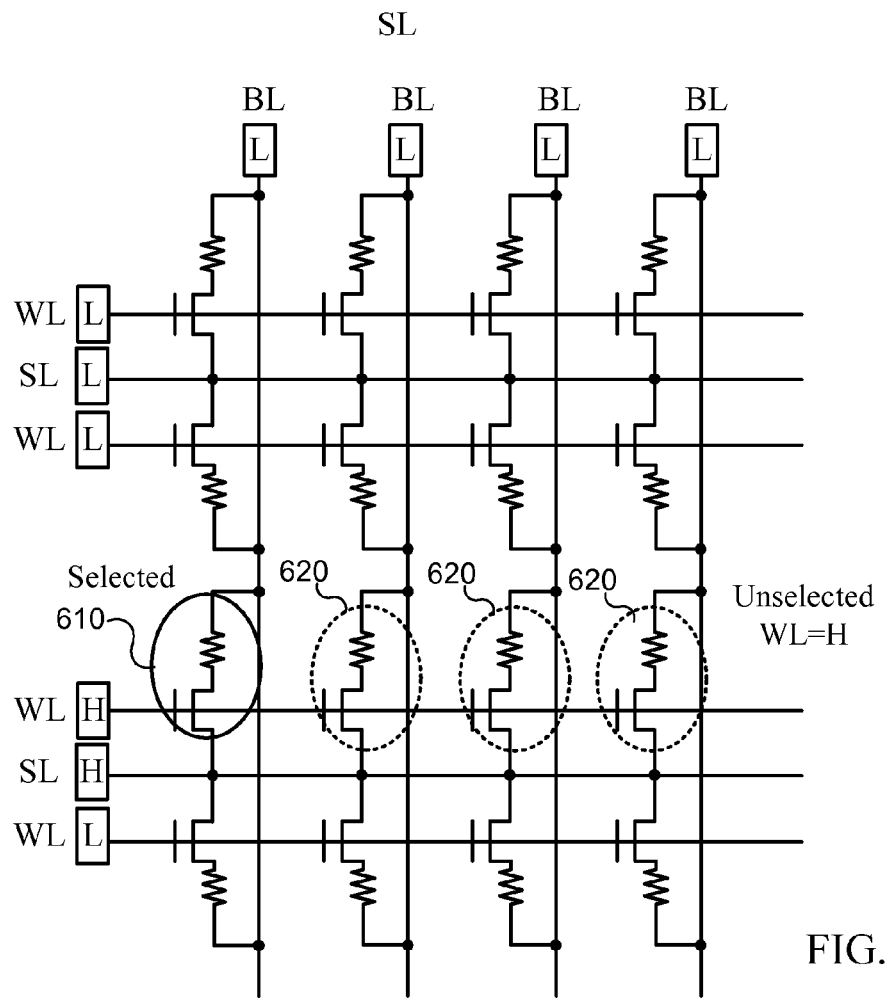
FIG. 6A is a schematic illustration of a reduced size bit cell arrangement for a STT-MRAM using conventional write logic and FIG. 6B is a layout of a reduced size bit cell arrangement.
Figure 6B:
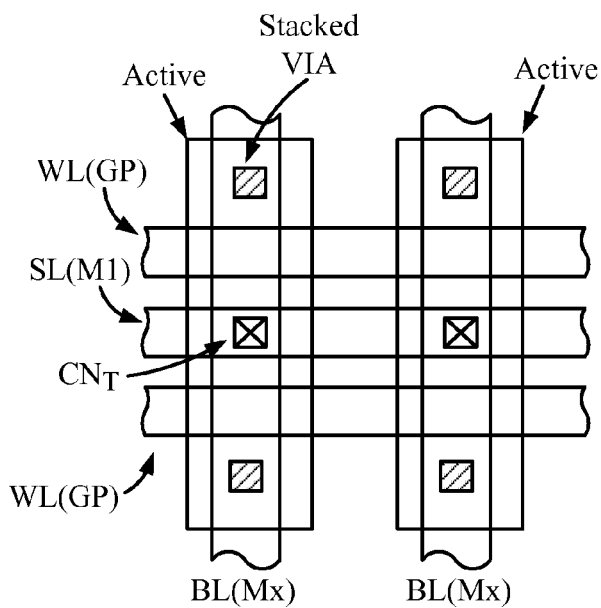

Referring to FIG. 6A, an arrangement of a STT-MRAM bit cell array according to an embodiment of the invention is illustrated that produces a reduced or minimum bit cell size. In contrast to the conventional design, such as illustrated in FIG. 4, the word lines (WL) and source lines (SL) are arranged substantially in parallel and substantially perpendicular to the bit lines (BL). For example, when compared to the layout illustrated in FIG. 4B, the vertical metal 1, which is parallel the bit line and perpendicular to the word line, used for the source line can be eliminated and thus bit cell area can be significantly reduced, as illustrated in FIG. 6B. In comparison to FIG. 4B, it is clear that the source lines (e.g., SL (M1) are no longer parallel with the bit lines. Accordingly, the configuration of FIG. 6B provides for the reduced cell size by allowing for the removal of the additional parallel metal lines and connections used for the source line of FIG. 4B. Further, using the illustrated arrangement, the source line can be shared for all cells along a given word line direction. In some embodiments of the invention, the source line can be shared between two adjacent bit cells and can be positioned between the word lines (e.g., WL (Gp)) as illustrated.

However, using the conventional logic for write operations creates a potential invalid write operation on the unselected cells 620. For example, in a write operation of a "1", the selected cell 610 has WL=H, BL=L and SL=H. However, the unselected bit cells 620 will also be subject to an invalid write because each will have similar signals applied (i.e., WL=H, BL=L and SL=H). Accordingly, using conventional write logic in a reduced bit cell size design can lead to problems during memory write operations.

Figure 7:
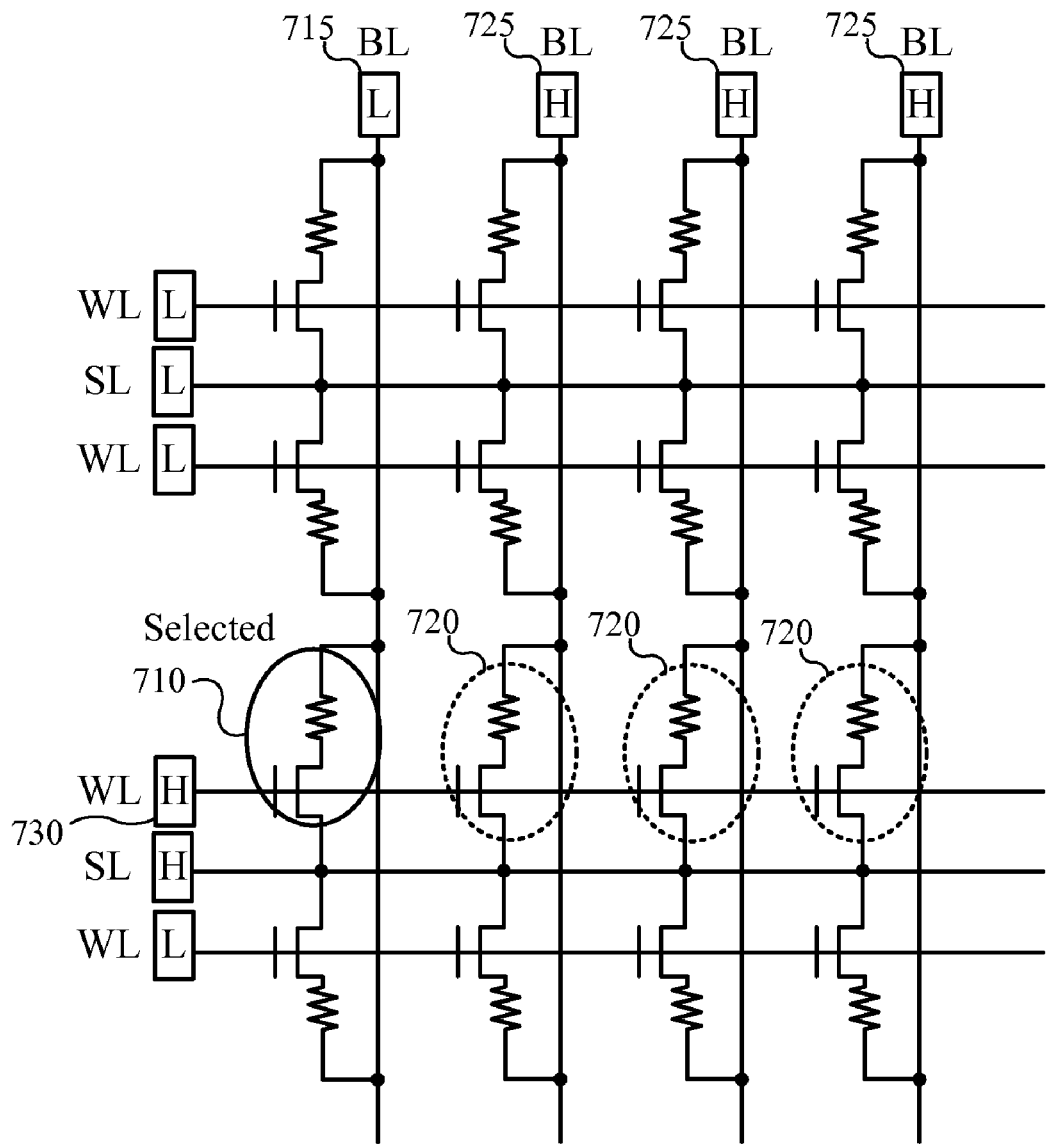
FIG. 7 is an illustration of a reduced size bit cell arrangement for a STT-MRAM including write logic levels.

FIG. 7 illustrates a solution to the aforementioned problems for write operations in reduced bit cell designs (e.g., parallel WL and SL) for STT-MRAM according to embodiments of the invention. Referring to FIG. 7, the unselected bit lines 725 can be driven to a high state during write "1" operations to resolve invalid write operations for unselected bit-cells 720. For example, when writing a "1" to the selected bit cell 710, the write logic sets WL(730)=H, BL(715)=L and SL(740)=H. Accordingly, unselected bit-cells 720 also have WL(730)=H, and SL(740)=H during the write operation of bit cell 710. Then, to prevent an invalid write operation in the unselected bit cells 720, unselected BLs 725 are set to H during the write cycle for writing "1" to the selected bit cell 710. It can be appreciated that the write control logic for the unselected bit lines will be designed to apply a high (H) voltage/logic signal during the write operations. Alternatively, the unselected bit lines can be placed in a high impedance state, which would prevent any current flow through the unselected bit lines. The write control logic can be implemented using any device or combination of devices that can perform the functionality described herein. Accordingly, embodiments of the invention are not limited to the specific circuits or logic illustrated herein to perform the functionality described.

Figure 8:
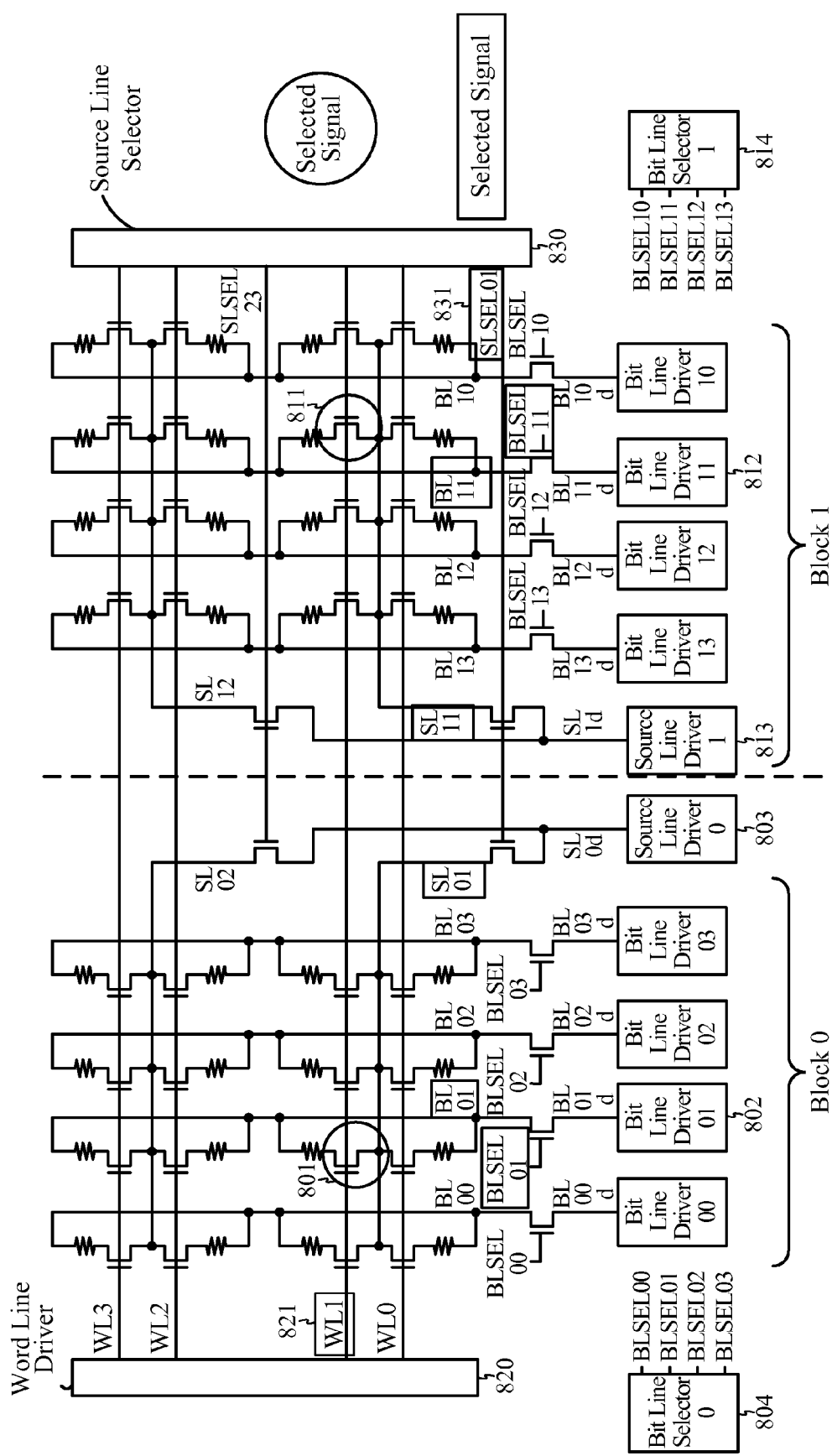
FIG. 8 is a illustration of an STT-MRAM array.

Referring to FIG. 8, an example of a STT-MRAM array is illustrated. As noted above, the unselected bit lines (BLs) in the array are set to a high state while the selected BLs associated with cells 801 and 811 are set to a low state in one write configuration. The selected signals are denoted with a rectangular box and the selected cells are denoted with a circle. Accordingly, for bit cells 801 and 811 to be selected, the word line (WL) driver 820 activates WL1 821. WL1 821 activates the access (word line) transistor associated with cells 801, 811 and other cells along the word line 821. Likewise, source line selector 830 activates a select line 831 coupled to source lines SL01 and SL11. Specifically, select line 831 activates transistors associated with source lines SL01 and SL11, which are coupled to source line drivers 803 and 813, respectively. Additionally, bit line selectors 804 and 814 select bit line drivers 802 and 812, respectively. As discussed above, for this example, bit line drivers 802 and 812 could be set to a low level and the remaining unselected bit line drivers could be set to a high level. Accordingly, bit cells 801 and 811 can be selected out of array 800. Although, the example discussed above describes specific cells being selected in the array for block0 and block1, it will be appreciated that any cell could have been selected using the illustrated logic. Further, cells in both blocks do not have to be selected. Additionally, it will be appreciated that the array dimensions are arbitrary and can be scaled up or down as needed and the various drivers/selectors can be reconfigured to provide more or less resolution in selecting the individual bit cells. A more detailed discussion of specific implementations of the logical blocks illustrated is provided below. However, these details are being provided as examples and are not intended to limit embodiments of the invention to the illustrated circuits, logic or discussed features.

Figure 9:
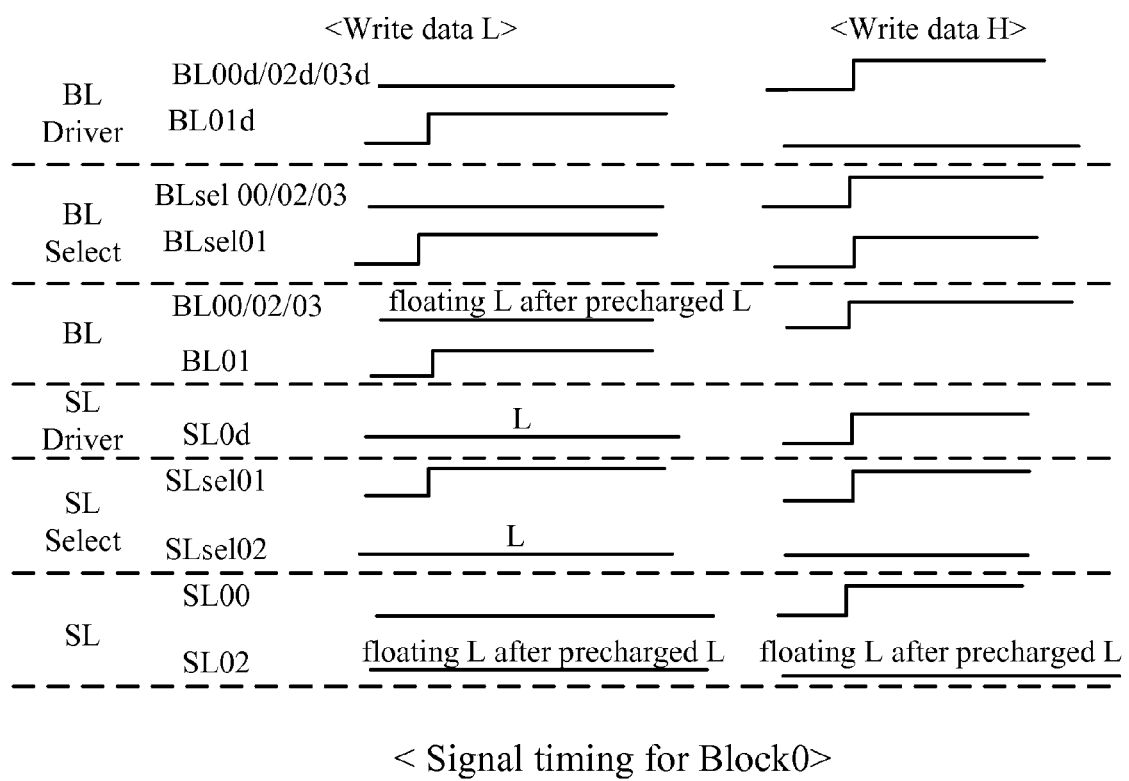
FIG. 9 is an illustration of signaling timing for a block memory in the STT-MRAM array of FIG. 8.

FIG. 9 illustrates a timing diagram for signaling related to block0 of FIG. 8. Additionally, following is a list of conditions for the various signals based on the assumptions that the bit line (BL)/source line (SL) are precharged to 0 or a low level and that the cells are selected as illustrated in FIG. 8.

Write data L
    Selected BL=H
    Unselected BLs=Floating L
    BL selection signal for selected BL=H
    BL selection signal for unselected BL=L
    Selected SL=L
    Unselected SL=Floating L
    SL selection signal for selected SL=H
    SL selection signal for unselected SL=L
Write data H
    Selected BL=L
    Unselected BLs=H
    BL selection signal for selected BL=H
    BL selection signal for unselected BL=H
    Selected SL=H
    Unselected SL=Floating L
    SL selection signal for selected SL=H
    SL selection signal for unselected SL=L As noted above, H is a high voltage/logic level and L is a low voltage/logic level and these levels may be supply voltage levels or may be higher or lower than the supply voltage levels. The term Floating L generally indicates the line was at a low voltage prior to being decoupled from the low voltage source.

The foregoing listing is provided merely for illustration and it in conjunction with the illustrated timing signals of FIG. 9 illustrate the discussed selection of bit cells of Block 0 in FIG. 8. For example, as discussed above, the unselected bit lines (e.g., BL00, BL02, BL03) are set to a high level, the selected bit line (e.g., BL01) is set to a low level and the associated source line (SL00) is set to a high level, when writing a data "H" or "1". In contrast, when writing data "L" or "0", the unselected bit lines (e.g., BL00, BL02, BL03) are set to a low level, the selected bit line (e.g., BL01) is set to a high level and the associated source line (SL00) is set to a low level. The corresponding signals for the bit line driver (BL Driver), bit line select signals (BL Select), source line driver (SL Driver), and source line select (SL Select) are also illustrated. Circuits and logic for implementing these functions will be described in greater detail below. Accordingly, a detailed description of each signal will not be provided. It should also be noted that different data (data L or data H) can be written to block0 and block1. For example, to write data L to block0 and data H to block1, write data L signals and timing of FIG. 9 can be applied to block0 and write data H signals and timing of FIG. 9 can be applied to block1.

Figure 10A:
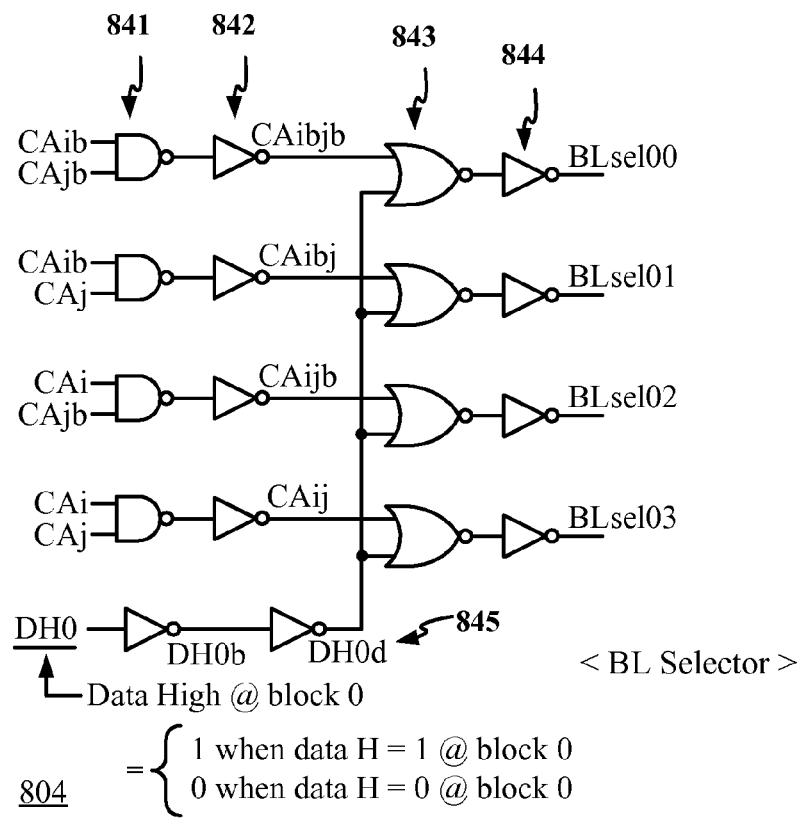
FIG. 10A is an illustration of a bit line selector that could be used in the STT-MRAM array of FIG. 8.

FIG. 10A illustrates an example of a bit line selector circuit. For example, using column address inputs (CAi and CAj) and their complements (CAib, CAjb), as inputs to NAND gates 841, in combination with the inverters 842, NOR gates 843, inverters 844 and data signal DH0 (data high (H) at block0), the appropriate bit line can be selected and level (e.g., H/L) can be provided. For example, the two bit input of CAi,j (00, 01, 10, 11) can be used to select one of the four bit lines. The data high logic signal can be buffered by inverters 845 and then provided to NOR gates 843 along with the output of inverters 842. Accordingly, when the data signal DH0 is high, the output of all NOR gates 843 will be 0 (low) and the corresponding output of the inverters 844 will be high. However, when the output data signal DH0 is low, the output of NOR gates 843 will be controlled by the output of inverters 842 (based on the column address inputs), which will also control the output of inverters 844. Accordingly, the signals can be configured so that output of NOR gates 843 are provided to inverters 844, so only one bit cell is selected (or set to a different value than the remaining bit line select signals). The outputs (BLse100-BLse103) of bit line selector 804 are provided to transistors in series with corresponding bit line drivers (e.g., BL driver 00-03) to enable the respective bit lines.

For example, when DH0 is low, the circuit is configured to write data "0" to the cell. The selected BL is high and source line is low. Additionally, all source lines of cells which uses selected WL are low. For the unselected cells, the bit line should be low to prevent invalid data "0" write into unselected cells. Thus, the selected bit line is high while remaining lines are low, which is the opposite state of that illustrated in FIG. 7.

Figure 10B:
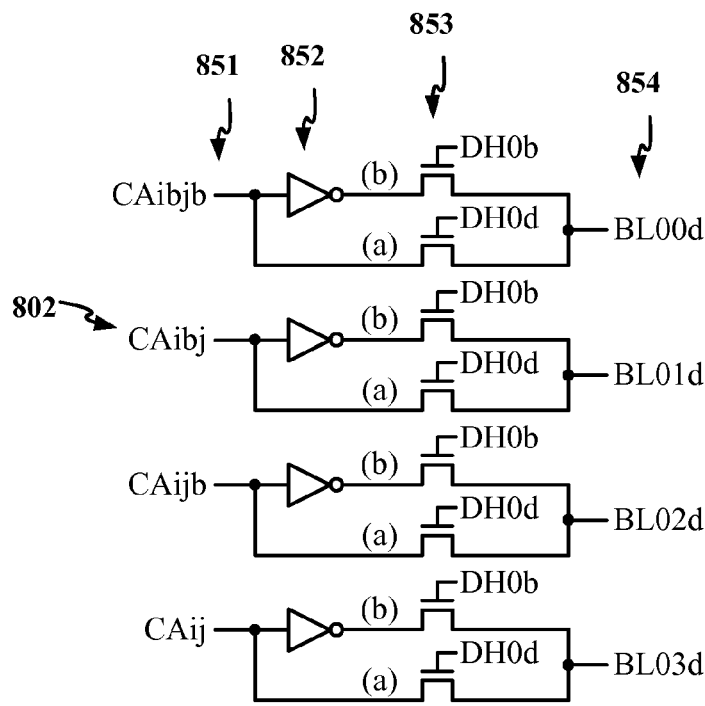
FIG. 10B is an illustration of a bit line driver that could be used in the STT-MRAM array of FIG. 8.

FIG. 10B illustrates an example of a bit line driver. The signals (e.g., CAibjb, CAibj, CAijb, CAij) derived from column address inputs (CAi and CAj) and their complements (CAib, CAjb), can be provided as inputs to the bit line drivers (e.g., 802). For example, these signals could be separately derived or could be obtained from the out of gates 841 from FIG. 10A. Inverters 852 are coupled between input nodes 851 and transistors (or switches) 853(b). Another pathway is provided between input nodes 851 and transistors 853(a). The transistors 853(a) and 853(b) are also coupled to inverters 854. Data signal DH0 is used to provide both a complement (DH0b) and non-complement signal (Dh0d), which are provided to the inputs (gates) of transistors 853(b) and 853(a), respectively. Accordingly, when DH0 is low, the complement path through 853(b) is active and when DH0 is high, the non-complement path through 853(a) is active. Thus, the appropriate bit line level (e.g., H/L) can be provided from each bit line driver (BL driver 00/01/02/03). For example, If DH0=0 (when write data is L), then BL00d=CAibjb/BL01d=CAibj/BL02d=CAijb/CA03d=CAij. Only one of BL00d/01d/02d/03d is high since only one of CAibjb/CAibj/CAijb/Caij is high. However, if DH0=1 (when write data is H) BL00d=complement(CAibjb)/BL01d=complement(CAibj)/BL02d=complement(CAijb)/CA03d=complement(CAij). Accordingly, only one of BL00d/01d/02d/03d will be low, since only one of CAibjb/CAibj/CAijb/Caij is high.

Figure 11A:
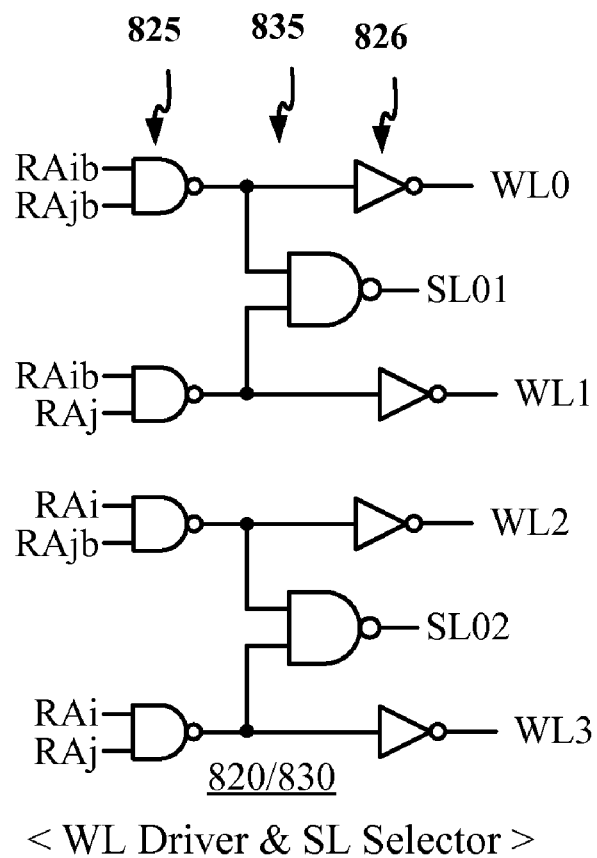
FIG. 11A is an illustration of a combined word line driver and source line selector that could be used in the STT-MRAM array of FIG. 8.

FIG. 11A illustrates an example of a circuit that can be used for word line driver (e.g., 820) and also for the source line selector (e.g., 830). For example assuming four word lines and two source select lines, as illustrated, NAND gates 825 can receive row address i and j inputs (RAi and RAj) and complements thereof. The outputs of NAND gates 825 are provided to inverters 826 to invert and buffer the signal and drive the respective word line. The outputs of NAND gates 825 are also provided in pairs to NAND gates 835 to select the appropriate source line. Since the source lines are shared between two cells, the source line selector can be configured to be enabled when any of the two adjacent word lines are enabled. However, the foregoing circuit could also be arranged into two or more independent circuits. For example, the row address i and j inputs (RAi and RAj) could be provided directly to a source select circuit comprising NAND gates 825 and NAND gates 835 and the NAND gates 835 could be removed from the word line driver circuit. Accordingly, embodiments of the invention are not limited to the illustrated configurations contained herein.

Figure 11B:
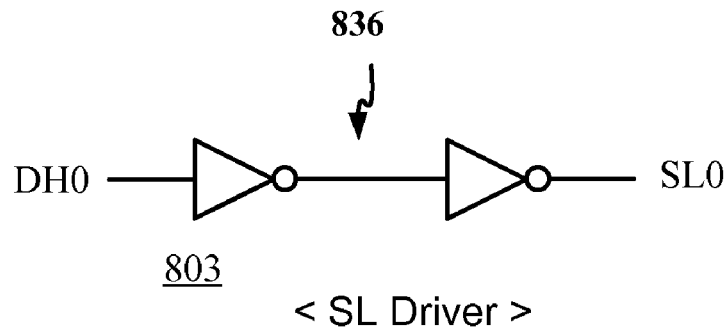
FIG. 11B is an illustration of a source line driver that could be used in the STT-MRAM array of FIG. 8.

FIG. 11B illustrates an example of a source line driver. The driver can receive signal DH0, which is buffered by inverters 836. Since there are two inverters in series, DH0 is not inverted by the source line driver 803 as illustrated. However, it will be appreciated that this configuration could be replaced by a single non-inverting amplifier/driver. Likewise, any of the foregoing circuits can be modified using components known in the art to achieve a similar functionality. Accordingly, the embodiments illustrated herein are merely for the convenience of providing examples and explanation and are not intended to limit the scope of embodiments of the invention.

In view of the foregoing, it will also be appreciated that embodiments of the invention include methods, steps, actions, sequences, algorithms and/or processes to achieve the functionalities discussed herein. For example, an embodiment can include a method for forming an STT-MRAM array having a shared source line configuration. Accordingly, an embodiment can include a method comprising forming a Spin Transfer Torque Magnetoresistive Random Access Memory (STT-MRAM) bit cell array having a source line substantially parallel to a word line of the first row of bit cells and substantially perpendicular to a bit line. Aspects can further include forming a word line of a second row of bit cells substantially in parallel with the word line; and coupling the source line to bit cells that are coupled to one of the word lines of the first and second row of bit cells. Embodiments for writing to the memory array can include establishing a low voltage on a bit line of a selected bit cell coupled to the word line and the source line and establishing a high voltage on bit lines of unselected bit cells coupled to the word line of the first bit cells and the source line (see, e.g., FIGS. 7 and 9).

While the foregoing disclosure shows illustrative embodiments of the invention, it should be noted that various changes and modifications could be made herein without departing from the scope of embodiments of the invention as defined by the appended claims. The functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) comprising:
   a bit cell array having a source line substantially parallel to a word line coupled to a first row of bit cells, wherein the source line is substantially perpendicular to bit lines coupled to the first row of bit cells.

2. The STT-MRAM of claim 1, further comprising:
   a word line coupled to a second row of bit cells, wherein the source line is coupled to the second row of bit cells.

3. The STT-MRAM of claim 1, wherein the source line is disposed between the word line of the first row of bit cells and the word line of second row of bit cells.

4. The STT-MRAM of claim 1, further comprising:
   logic configured to establish a low voltage on a bit line of a selected bit cell in the first row of bit cells coupled to the word line and the source line and configured to establish a high voltage on bit lines of unselected bit cells in the first row of bit cells coupled to the word line and the source line.

5. The STT-MRAM of claim 4, wherein the high voltage is a supply voltage level and the low voltage is a ground level.

6. The STT-MRAM of claim 4, wherein the logic configured to establish a low voltage on the bit line of the selected cell comprises:
   bit line select logic coupled to a plurality of bit line drivers.

7. The STT-MRAM of claim 6, wherein the bit line select logic is configured to receive a plurality of column address signals and a data high signal.

8. The STT-MRAM of claim 7, wherein each of the plurality of bit line drivers is coupled to an associated bit line based on a select signal from the bit line select logic.

9. The STT-MRAM of claim 8, wherein the select signals are derived from the column select address signals and complements of the column select signals.

10. The STT-MRAM of claim 9, wherein the column select address signals and their complements are provided to NAND gates and the outputs of the NAND gates are input to respective bit line drivers.

11. The STT-MRAM of claim 2, further comprising:
    logic configured to drive the word lines of the first and second row of bit cells and logic configured to select the source line.

12. The STT-MRAM of claim 11, wherein the logic to drive the word lines and the logic configured to select the source line are combined.

13. The STT-MRAM of claim 12, wherein the logic configured to drive the word lines of the first and second row of bit cells are coupled to row address inputs and logic configured to select the source line is coupled to the logic configured to drive the word lines.

14. The STT-MRAM of claim 13, wherein the logic configured to drive the word lines of the first and second row of bit cells comprises:
    a first NAND gate coupled to two row address inputs and having an output coupled to a first inverter to drive the word line of the first row of bit cells; and
    a second NAND gate coupled to two row address inputs and having an output coupled to a second inverter to drive the word line of the second row of bit cells.

15. The STT-MRAM of claim 13, wherein the logic configured to select the source line comprises a third NAND gate having inputs coupled to the outputs of the first and second NAND gate and an output to generate a source line select signal.

16. A method comprising:
    forming a Spin Transfer Torque Magnetoresistive Random Access Memory (STT-MRAM) bit cell array having a source line substantially parallel to a word line of a first row of bit cells and substantially perpendicular to bit lines coupled to the first row of bit cells.

17. The method of claim 16, further comprising:
    forming a word line coupled to a second row of bit cells substantially in parallel with the first row of bit cells; and
    coupling the source line to the second row of bit cells.

18. The method of claim 16, further comprising:
    disposing the source line between the word lines of the first and second row of bit cells.

19. A method for writing data in a Spin Transfer Torque Magnetoresistive Random Access Memory (STT-MRAM) having a source line substantially parallel to a word line coupled to a first row of bit cells, wherein the source line is substantially perpendicular to bit lines coupled to the first row of bit cells, the method comprising:
    establishing a low voltage on a bit line of a selected bit cell coupled to the word line of the first row of bit cells and the source line; and
    establishing a high voltage on bit lines of unselected bit cells coupled to the word line of the first row of bit cells and the source line.

20. The method of claim 19, wherein the high voltage is a supply voltage level and the low voltage is a ground level.

21. The method of claim 19, wherein establishing a low voltage on the bit line of the selected cell comprises:
    generating bit line select signals; and
    activating or deactivating bit line drivers based on the bit line select signals.

22. The method of claim 21, wherein the bit line select signals are generated from a plurality of column address signals and a data high signal.

23. The method of claim 22, wherein each of the plurality of bit line drivers is coupled to an associated bit line based on one of the bit line select signals.

24. The method of claim 22, wherein the bit line select signals are derived from the column address signals and complements of the column address signals.

25. The method of claim 24, wherein the column select addresses signals and their complements are provided to NAND gates and the outputs of the NAND gates are input to respective bit line drivers.

26. A Spin Transfer Torque Magnetoresistive Random Access Memory (STT-MRAM) having a source line substantially parallel to a word line coupled to a first row of bit cells, wherein the source line is substantially perpendicular to bit lines coupled to the first row of bit cells, the STT-MRAM comprising:
    means for establishing a low voltage on a bit line of a selected bit cell coupled to the word line of the first row of bit cells and the source line; and means for establishing a high voltage on bit lines of unselected bit cells coupled to the word line of the first row of bit cells and the source line.

27. The STT-MRAM of claim 26, wherein the means for establishing a low voltage on the bit line of the selected cell comprises:
   means for generating bit line select signals; and
   means for activating or deactivating bit line drivers based on the bit line select signals.

28. The STT-MRAM of claim 27, wherein the means for generating the bit line select signals receives a plurality of column address signals and a data high signal.

29. The STT-MRAM of claim 27, wherein the bit line drivers are coupled to column address signals and complements of the column address signals.

* * * * *

UNITED STATES PATENT AND TRADEMARK OFFICE
CERTIFICATE OF CORRECTION

PATENT NO. : 8,144,509 B2
APPLICATION NO. : 12/163359
DATED : March 27, 2012
INVENTOR(S) : Seong-Ook Jung et al.

Page 1 of 1

It is certified that error appears in the above-identified patent and that said Letters Patent is hereby corrected as shown below:

Title Page, Item [73], After the first assignee, add the following:

Yonsei University, Seoul, Korea (KR)

To be listed as follows:

[73] Assignees: QUALCOMM Incorporated, San Diego, CA (US)
Yonsei University, Seoul, Korea (KR)

Signed and Sealed this
Thirteenth Day of May, 2014

Michelle K. Lee
*Deputy Director of the United States Patent and Trademark Office*